| United States Patent [19] | [11] | 4,198,262 |
|---|---|---|
| Gay | [45] | Apr. 15, 1980 |

[54] SOLAR CELL MANUFACTURE

[75] Inventor: Charles F. Gay, Tujunga, Calif.

[73] Assignee: Atlantic Richfield Company, Los Angeles, Calif.

[21] Appl. No.: 24,921

[22] Filed: Mar. 29, 1979

[51] Int. Cl.$^2$ .......................................... H01L 21/306
[52] U.S. Cl. ...................................... 156/662; 29/572; 134/3; 136/89 SG; 136/89 CC; 156/657; 252/79.3
[58] Field of Search ............... 156/643, 646, 656, 657, 156/662, 664, 665; 29/572, 590; 252/79.3; 136/89 R, 89 SG, 89 CC; 357/17–19; 134/3, 41

[56] References Cited

U.S. PATENT DOCUMENTS

| 2,376,219 | 5/1945 | Winslow | 156/662 X |
| 2,966,432 | 12/1960 | Buck | 134/41 |
| 4,052,253 | 10/1977 | Kingzett | 134/3 X |
| 4,152,824 | 5/1979 | Gonsiorawski | 29/572 |

Primary Examiner—William A. Powell
Attorney, Agent, or Firm—Roderick W. MacDonald

[57] ABSTRACT

A method for manufacturing solar cells from a silicon wafer having a p-n junction therein and front and back contacts thereon, the improvement comprising washing said wafer with a buffered hydrofluoric acid solution having a pH of from about 3.5 to about 6.5 and containing from about 2 to about 10 weight percent hydrofluoric acid based on the total weight of the solution.

4 Claims, No Drawings

SOLAR CELL MANUFACTURE

BACKGROUND OF THE INVENTION

Solar cells normally have very shallow p-n junctions so that they may capture the blue end of the photo spectrum. Typically, the p-n junction lies approximately 0.3 micrometers beneath the surface of the semiconductor wafer.

In forming the junction, the semiconductor wafer is exposed at appropriate temperatures to a source of doping material selected to provide the desired p-n junction.

For example, in a boron doped, silicon semiconductor wafer which is a p-conductivity type wafer, a layer of phosphorous pentoxide glass is deposited over the entire surface of the wafer through chemical vapor deposition by flowing phosphorous oxychloride and oxygen into a diffusion chamber using a carrier gas of dry nitrogen. The interreaction of the silicon wafer with these gases and the formation of the phosphorous penetoxide glass provides sufficient phosphorous atoms to diffuse from the glass into the silicon surface and thereby provide the desired p-n junction.

To form the operative solar cell, the layer of phosphorous pentoxide glass is usually, but not necessarily, removed and the diffused layer of silicon removed from the silicon wafer except for one surface thereof so that appropriate electrical contacts can be attached to the front and back of the wafer. The undesired portions of the phosphorous pentoxide glass layer can be removed by acid etching, plasma etching, and the like.

Thereafter the front and back electrical contacts, to which wires or other conductors are ultimately to be soldered, are placed on the front and back of the wafer by various known methods such as contact metallization.

Thereafter the electrical contact-bearing wafer is usually washed with concentrated hydrofluoric acid to reduce the series resistance of the contacts and to render the electrical contacts on the wafer more solderable. However, this washing has been found sometimes to leave acid residue on the wafer, which residue is moisture sensitive. It is highly desirable to keep the wafer essentially moisture free in the final solar cell assembly. Therefore, it is desirable to minimize or eliminate such a residue.

SUMMARY OF THE INVENTION

According to this invention a buffered hydrofluoric acid solution is employed which has been found to minimize the moisture sensitive residue left on the electrical contact-bearing wafer.

According to this invention the wafer is washed in a buffered hydrofluoric acid solution which has a pH of from about 3.5 to about 6.5 and which contains from about 5 to about 10 weight percent hydrofluoric acid based on the total weight of the solution. The time of washing is that which is sufficient to reduce the series resistance of the wafer and to improve the solderability of the electrical contacts on the wafer.

Accordingly, it is an object of this invention to provide a new and improved method for manufacturing solar cells. It is another object to provide a new and improved method for reducing the moisture sensitive residue left on a solar cell after acid etching the contact-bearing cell.

Other aspects, objects and advantages of this invention will be apparent to those skilled in the art from this disclosure and the appended claims.

DETAILED DESCRIPTION OF THE INVENTION

In accordance with this invention a silicon wafer which has a p-n junction therein and front and back electrical contacts formed thereon by metallization, the back contact material being chosen so that it penetrates the p-n junction and forms a low resistance ohmic contact through the junction, is washed with a buffered hydrofluoric acid solution having a pH of from about 3.5 to about 6.5 and containing from about 5 to about 10 weight percent hydrofluoric acid based on the total weight of said solution. The washing time is for a period sufficient to reduce the series resistance of the wafer and to improve the solderability of the electrical contacts on the wafer and, therefore, can vary widely but is readily determined by one skilled in the art. The temperature and pressure of washing can be ambient or with elevated or reduced temperature if desired.

The buffered solution can contain from about $10^{-6}$ to about $10^{-4}$ molar free hydrofluoric acid with one or more buffering agents selected from a group consisting of ammonium bifluoride, ammonium fluoride, or combinations thereof.

The solution can be an aqueous solution to which has been added with mixing under ambient conditions of temperature and pressure the desired amounts of hydrofluoric acid and buffering agent or agents to give to the solution the above required pH and hydrofluoric acid content. Thereafter the wafers to be treated can simply be dipped or otherwise washed with the solution for the time desired.

For example, a silicon wafer is employed which originally contains a boron dopant and which subsequently has phosphorous diffused therein to establish the required p-n junction, and which has front and back electrical contacts formed by contact metallization. The front contact can be applied in any known manner such as by printing, and the like, using known contact materials such as silver paste, and the like. The back contact contains sufficient amount of material to penetrate the back p-n junction to form low resistance ohmic contacts and may also be applied by printing, and the like. Aluminum powder as well as gold, silver, palladium, and the like, can be employed for the back contact. Materials such as glass frit which forms the desired ohmic contact during an oxidation process can be employed with these metals as is known in the art.

After the contacts have been applied to the wafer, they are fired in air at about 650° C. for at least fifteen seconds.

Thereafter the wafer is dipped for about fifteen seconds in a solution which has a pH of about 6 and contains about 5 weight percent hydrofluoric acid based on the total weight of the solution and about 8 weight percent ammonium bifluoride based on the total weight of the solution.

After dipping and drying in air the wafer will have a minimum of moisture sensitive acid residue thereon and will have the desired reduced series resistance and ready solderability.

Reasonable variations and modifications are possible within the scope of this disclosure without departing from the spirit and scope of this invention.

The embodiments of the invention in which an exclusive property or privilege is claimed are defined as follows:

1. In a method for manufacturing solar cells from a silicon wafer having a p-n junction therein, wherein front and back electrical contacts are formed on said wafer by metallization, said back contact material being chosen so that it penetrates said p-n junction and forms a low resistance ohmic contact through said junction, the improvement comprising washing said electrical contact-bearing wafer with a buffered hydrofluoric acid solution having a pH of from about 3.5 to about 6.5 and containing from about 5 to about 10 weight percent hydrofluoric acid based on the total weight of said solution for a time sufficient to reduce the series resistance of said wafer and to improve the solderability of said electrical contacts.

2. A method according to claim 1 wherein said silicon wafer originally contains boron and phosphorous is diffused into said boron containing wafer to establish said p-n junction.

3. A method according to claim 1 wherein said buffered solution contains from about 5 to about 40 weight percent based on the total weight of said solution of a buffering agent selected from the group consisting of ammonium bifluoride and ammonium fluoride, and combinations thereof.

4. A method according to claim 2 wherein said buffered solution contains from about 5 to about 40 weight percent based on the total weight of said solution of a buffering agent selected from the group consisting of ammonium bifluoride and ammomium fluoride, and combinations thereof.

* * * * *